United States Patent
Mooradian

(12) 
(10) Patent No.: US 6,243,407 B1
(45) Date of Patent: *Jun. 5, 2001

(54) HIGH POWER LASER DEVICES

(75) Inventor: Aram Mooradian, Winchester, MA (US)

(73) Assignee: Novalux, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/888,533

(22) Filed: Jul. 7, 1997

Related U.S. Application Data

(60) Provisional application No. 60/041,185, filed on Mar. 21, 1997.

(51) Int. Cl.[7] ........................................... H01S 3/08
(52) U.S. Cl. ................................... 372/92; 372/82; 372/83
(58) Field of Search ............................ 372/82, 83, 92, 372/43, 50

(56) References Cited

U.S. PATENT DOCUMENTS

| | | | |
|---|---|---|---|
| 4,479,224 | 10/1984 | Rediker | 372/92 |
| 4,881,236 | 11/1989 | Brueck et al. | 372/45 |
| 4,991,179 | 2/1991 | Deppe et al. | 372/45 |
| 5,091,915 | * 2/1992 | Tatsumi | 372/75 |
| 5,301,201 | 4/1994 | Dutta et al. | 372/45 |
| 5,325,386 | 6/1994 | Jewell et al. | 372/50 |
| 5,337,327 | * 8/1994 | Ackley | 372/45 |
| 5,388,120 | 2/1995 | Ackley et al. | 372/99 |
| 5,412,680 | 5/1995 | Swirhun et al. | |
| 5,420,880 | 5/1995 | Tabatabaie et al. | 372/46 |
| 5,461,637 | * 10/1995 | Mooradian | 372/92 |

(List continued on next page.)

FOREIGN PATENT DOCUMENTS

| | | | |
|---|---|---|---|
| 0 772 266 A1 | 5/1997 | (EP) | H01S/3/085 |
| 0 795 941 A1 | 9/1997 | (EP) | H01S/3/085 |
| 0 795 941 B1 | 10/1999 | (EP) | H01S/3/085 |
| 2304993A | 3/1997 | (GB) | H10S/3/085 |
| 2311166A | 9/1997 | (GB) | H01S/3/085 |
| WO 95/07566 | 3/1995 | (WO) | H01S/3/19 |
| WO 95/25366 | 9/1995 | (WO) | H10S/3/085 |

OTHER PUBLICATIONS

Shin, J. et al., "Anomalous Above–Threshold Spontaneous Emission in Gain–Guided Vertical–Cavity Surface–Emitting Laser", *Applied Physics Letters*, vol. 68, No. 16, Apr. 15, 1996, pp. 2180–2182.

(List continued on next page.)

*Primary Examiner*—Rodney Bovernick
*Assistant Examiner*—Robert E. Wise
(74) *Attorney, Agent, or Firm*—Fulbright & Jaworski L.L.P.

(57) ABSTRACT

In an apparatus and method for generating high power laser radiation, the geometry of the resonant laser cavity defines a fundamental spatial or transverse cavity mode. A gain medium is disposed within the resonant cavity and an energy source energizes the gain medium within a first volume. This causes spontaneous and stimulated energy emission to propagate in the gain medium in a direction transverse to the fundamental cavity mode. The transverse emission in turn optically pumps a second volume of the gain medium about the first volume. When the intensity of the emission is sufficiently high, inversion and gain are produced in the second volume. By optimizing the geometry of the cavity such that the fundamental cavity mode is coupled to both the first and the second volumes encompassing the first pumped volume, the transversely-directed energy of the first volume which would otherwise be wasted is instead captured by the fundamental beam, improving the overall power efficiently of the laser. When configured in an external cavity, the high-power laser of the present invention is especially amenable to frequency conversion of the output beam, as it provides beam intensities suitable for efficient nonlinear frequency conversion.

45 Claims, 4 Drawing Sheets

U.S. PATENT DOCUMENTS

| | | |
|---|---|---|
| 5,513,203 | 4/1996 | Damen . |
| 5,513,204 | 4/1996 | Jayaraman .............................. 372/96 |
| 5,594,751 * | 1/1997 | Scott ...................................... 372/92 |
| 5,706,306 | 1/1998 | Jiang et al. . |
| 5,724,375 | 3/1998 | Peters . |

OTHER PUBLICATIONS

Takaaki, N., Patent Abstracts of Japan, vol. 95, No. 003, Apr. 28, 1995 (Publ. No. 06 350 191 JP, Dec. 22, 1994).

Nishikawa, T. et al., "Influence of Photon Reabsorption on the Transfer Efficiency of Output Intensity in Semiconductor Microcavities", *IEEE Photonics Technology Letters*, vol. 9, No. 2, Feb. 1997, pp. 179–181.

Deppe, E. et al., "Very–Low–Threshold Index–Confined Planar Microcavity Lasers", *IEEE Photonics Technology Letters*, vol. 7, No. 9, Sep. 1995, pp. 965–967.

Grabherr, M. et al., "Efficient bottom–emitting VCSEL arrays for high CW optical output power", *Electronics Letters*, vol. 34, No. 12, Jun. 1998, pp. 1227–1228.

Gourley, P.L., et al., "Coherent beams for high efficiency two–dimensional surface–emitting semiconductor laser arrays," *Appl. Phys. Lett.*, vol. 58, No. 9, Mar. 4, 1991, pp. 891–892.

Morgan, R., et al., "Optical characteristics of two–dimensional coherently coupled vertical–cavity surface–emitting laser arrays,"*Optics Letters*, vol. 18, No. 5, Mar. 1, 1993, pp. 352–354.

Jiang, W.B., et al., "High powers and subpicosecond pulses from an external–cavity surface–emitting InGaAs/InP multiple quantum well laser," *Appl. Phys. Lett.* 58 (8), Feb. 25, 1991, pp. 807–809.

Sun, D.C., et al., "High power and high efficiency vertical cavity surface emitting GaAs laser," *Appl. Phys. Lett.* 61, (13) Sep. 28, 1992, pp. 1502–1503.

Le, H.Q., et al., "Diode–laser pumped InGaAs/GaAs/AIGaAs heterostructure lasers with low internal loss and 4–W average power," *Appl. Phys. Lett.* 63 (11), Sep. 13, 1993, 1465–1467.

Hadley, M.A., et al., "High single–transverse–mode output from external–cavity surface–emitting laser diodes," *Appl. Phys. Lett.*, vol. 63, No. 12, Sep. 20, 1993. pp. 1607–1609.

Wilson, G.C., et al., "High single–mode output power from compact external microcavity surface–emitting laser diode," *Appl. Phys. Lett.* vol. 63, No. 24, Dec. 13, 1993, pp. 3265–3267.

Morgan, R.A., et al., "Progress and Properties of High–Power Coherent Vertical Cavity Surface Emitting Laser Arrays," *SPIE*, vol. 1850, *Laser Diode Technolgy and Applications V* (1993), pp. 100–107.

Vakhshoori, D., et al., "Zone lasers," *Appl. Phys. Lett.* 65 (2), Jul. 11, 1994, pp. 144–146.

Dellunde, J., et al., "Transverse–mode selection in external–cavity vertical–cavity surface–emitting laser diodes," *J. Opt. Soc. Am. B.* vol. 13, No. 11, Nov. 1996, pp. 2477–2483.

* cited by examiner

HIGH POWER LASER DEVICES

RELATED APPLICATIONS

This application claims the benefit of U.S. Provisional Application No. 60/041,185, filed Mar. 21, 1997, the contents of which are incorporated herein by reference.

BACKGROUND OF THE INVENTION

Semiconductor lasers in common use today include edge-emitting diode lasers and vertical cavity surface emitting lasers (VCSELs). In an edge-emitting laser, a semiconductor gain medium, for example a quantum-well semiconductor structure, is formed on a surface of a semiconductor substrate. Cavity mirrors are formed or otherwise positioned on opposite sides of the substrate, perpendicular to the substrate surfaces, to form a resonant cavity which includes the gain medium. Electrical or optical pumping of the gain medium generates a laser beam which propagates in a direction along the plane of the substrate.

Edge-emitting lasers are among the most common semiconductor laser devices. Available commercially as individual units and in linear bar arrays, they are used, for example, as an optical pump source for pumping solid state lasers. High power, typically greater than a few hundred milliwatts, adaptations of edge-emitting lasers commonly operate in high order spatial modes and at multiple frequencies. This prevents their use in applications which require high power laser output in a single spatial mode and/or at a single frequency. Edge emitters also have a significant degree of astigmatism and a beam aspect ratio which is generally large, making it difficult to focus the beam to a small spot, which prevents their use in those applications which require a focused output beam. Poor beam quality in edge-mitting lasers also makes frequency doubling of the laser output using nonlinear optical materials difficult and inefficient.

In conventional VCSEL lasers, cavity mirrors are formed or otherwise positioned on opposite faces of a semiconductor gain medium grown on a semiconductor substrate. Electrical or optical pumping generates a laser beam emitted in a direction orthogonal to the plane of the substrate.

Conventional VCSELs find application in optical communications and optical interconnect systems. VCSEL lasers are characterized by generally low fundamental spatial mode $TEM_{00}$ output powers, limited to about 8 milliwatts (mW) continuous wave (cw), and are further characterized by small fundamental spatial mode beam diameters, on the order of several micrometers ($\mu$m). Larger area VCSEL emitters, with beam diameters on the order of 100 $\mu$m can produce output beams having a few hundred mW of cw output power. However, operation of conventional VCSELs at high power and large diameter generally carries with it the penalty of an output beam having high-order spatial modes and multiple frequencies. In an external cavity VCSEL configuration, referred to in the art as a vertical external cavity surface emitting laser (VECSEL), an external reflector serves as the output coupler. External cavity VECSEL devices can provide higher fundamental spatial mode output power than VCSEL devices.

Previous work on external cavity vertically emitting semiconductor lasers typically resulted in low output power. The work of Sandusky and Brueck, for example, produced low output power and used optical pumping to excite the semiconductor. See J. V. Sandusky and S. R. J. Brueck, "A cw external cavity surface-emitting laser", *Photonics Technology Letters*, vol. 8 pp. 313–315, 1996. In a study by Hadley et al., an electrically excited VCSEL in an external cavity produced 2.4 mW cw and 100 mW pulsed in a fundamental spatial mode. In this case, an emitting area up to 120 $\mu$m was used. See M. A. Hadley, G. C. Wilson, K. Y. Lau and J. S. Smith, "High single-traverse mode output from external cavity surface emitting laser diodes", *Applied Phys. Letters*, vol. 63, pp. 1607–1609, 1993.

For various laser applications, a beam generated by the laser is subjected to frequency conversion or frequency doubling. This is accomplished by introducing a non-linear material, for example KTP, KTN, $KNbO_3$, and $LiNbO_3$ into the laser path. The frequency of a beam incident on the non-linear material is converted to a second frequency. The non-linear materials are referred to as "doubling crystals" where the property of the material is such that it serves to double the frequency of a beam traversing the crystal. Efficient frequency conversion by the material generally requires a high-intensity, single mode incident beam.

Frequency doubling of semiconductor lasers has been demonstrated in the past to varying degrees of success using a doubling crystal mounted external to an edge-emitting diode laser cavity. The output beams from edge-mitting diode lasers are usually highly divergent and have significant aspect ratios as well as some degree of astigmatism which degrades the optical field intensity and phase front from that which is ideally required for efficient frequency doubling. Experiments have been carried out in which the light from a diode laser is launched into an optical waveguide fabricated in a non-linear material in order to maintain the optical field intensity over some relatively long path length. This technique is generally complicated and uses relatively low power diode lasers which have sufficient beam quality to launch the laser light into the external waveguide.

Various techniques in the past have attempted to harness beam power to enable efficient conversion. A first technique by Gunter, P. Gunter et al. "Nonlinear optical crystals for optical frequency doubling with laser diodes", Proc. of SPIE, vol. 236, pages 8–18, 1980, demonstrated low efficiency frequency doubling of diode laser radiation using potassium niobate $KNbO_3$ in a single-pass doubling configuration. In another technique, Koslovsky et al., Optics Letters 12, 1014, 1987, employed a single spatial mode, edge-emitting diode laser and $KNbO_3$ in an external ring resonator to increase the circulating power to achieve frequency conversion. The Koslovsky configuration required frequency-locking of the single-frequency laser to the Fabry-Perot resonance of the ring cavity as well as matching the temperature of the non-linear crystal to both frequencies. This required complicated crystal alignment and wavelength control circuitry to maintain frequency locking.

SUMMARY OF THE INVENTION

The present invention is directed to an apparatus and method for generating high power laser radiation in a single fundamental spatial mode, in a manner which overcomes the aforementioned limitations. The laser of the present invention, when configured in an external cavity, is especially amenable to frequency conversion of the output beam, as it provides beam power densities over suitable path lengths for efficient frequency conversion.

In a first embodiment of the present invention, the apparatus comprises a resonant cavity defined between first and second partial reflectors. The geometry of the resonant cavity defines a fundamental spatial or transverse cavity mode. A gain medium is disposed within the resonant cavity, and an energy source energizes the gain medium within a first volume. This causes spontaneous and stimulated energy emission to propagate in the gain medium in a direction transverse to the fundamental cavity mode. The transverse emission, in turn, optically pumps a second volume of the gain medium about the first volume. When the intensity of the spontaneous emission is sufficiently high, inversion and gain are produced in the second volume. The energy within the first and second volumes is coupled into the fundamental cavity mode laser beam.

By optimizing the geometry of the cavity such that the fundamental cavity mode is coupled to both the first and second volumes, the energy of the first volume transversely-directed into the second volume, which would otherwise be wasted is instead captured by the fundamental beam, improving the overall power efficiency of the laser. To effect this, in a preferred embodiment, the cavity mirrors are selected to match the fundamental cavity mode to the cross-sectional diameter of the second volume. In this manner, the laser energy in the fundamental spatial mode is efficiently extracted from both first and second volumes of the gain medium. Similar results apply where the output energy is in a higher order spatial mode.

In a preferred embodiment, the first volume is substantially cylindrical and of cross sectional diameter $D_1$, and the second volume is substantially an annulus of outer cross-sectional diameter $D_2$ and inner cross-sectional diameter $D_1$, the first and second volumes being substantially cross-sectionally concentric.

The gain medium is preferably formed of a semiconductor material in a vertical cavity configuration. Alternatively, the gain medium may be formed of a solid state material having an active ion which has absorption in the spectral region of the gain transition. Examples of such solid state materials include Er:glass, Yb:glass, and Yb:YAG. In the case of solid state materials, pump energy would be preferably generated by optical means, for example a diode laser.

A nonlinear crystal may be placed in the optical cavity or external to the laser to change the laser output frequency. Suitable materials for nonlinear conversion include KTP, KTN, $KNbO_3$, and $LiNbO_3$ and periodically-poled materials such as periodically-poled $LiNbO_3$.

A preferred embodiment of the present invention, described in detail below, is capable of generating intracavity circulating power levels in excess of 100 kW in a fundamental spatial mode for a 1 mm diameter beam. These levels are sufficient for producing harmonic conversion of the fundamental radiation in a non-linear material. As an example, frequency doubling in a semiconductor configuration using GaInAs gain media provides a fundamental wavelength of 900 nm to 1100 nm and a frequency doubled output in the blue to green wavelengths.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
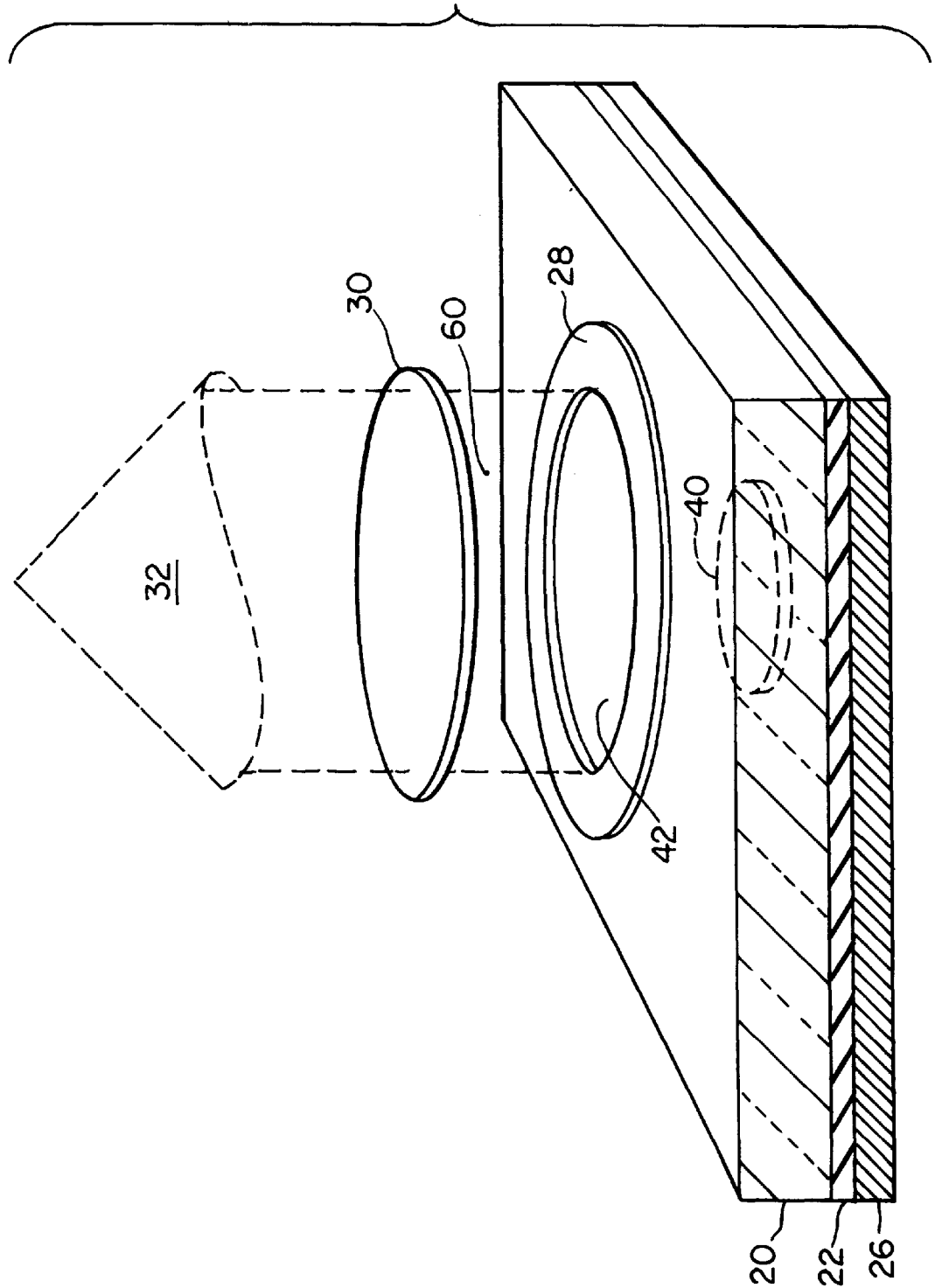
FIG. 1 is a perspective view of a VCSEL laser configuration in accordance with the present invention.

FIG. 1 is a perspective view of a preferred embodiment of the present invention, in a VCSEL configuration. The laser of FIG. 1 includes a semiconductor substrate 20, upon a first face of which is formed a semiconductor quantum-well gain region 22. A first reflector 26, for example a p-Bragg reflector, is formed on the quantum-well region 22. A second external reflector 30 is positioned opposite the first reflector 26. The distance between the first and second reflectors 26, 30 and their respective curvatures define a fundamental cavity mode 60. The second reflector 30 is illustrated as an external cavity mirror in FIG. 1 in accordance with a VECSEL configuration; however, the second reflector 30 may alternatively be layered directly adjacent the second face of the substrate to provide a VCSEL configuration. Note that for purposes of the present invention, the term "reflector" as used herein includes partially and/or fully reflective materials and/or surfaces. The surface 42 of the substrate 20 facing the second reflector 30 preferably is treated with an anti-reflection coating 42, such that any beam energy 60 traversing that interface will pass with minimal reflection, a desirable feature as is well known in the prior art.

Figure 2:
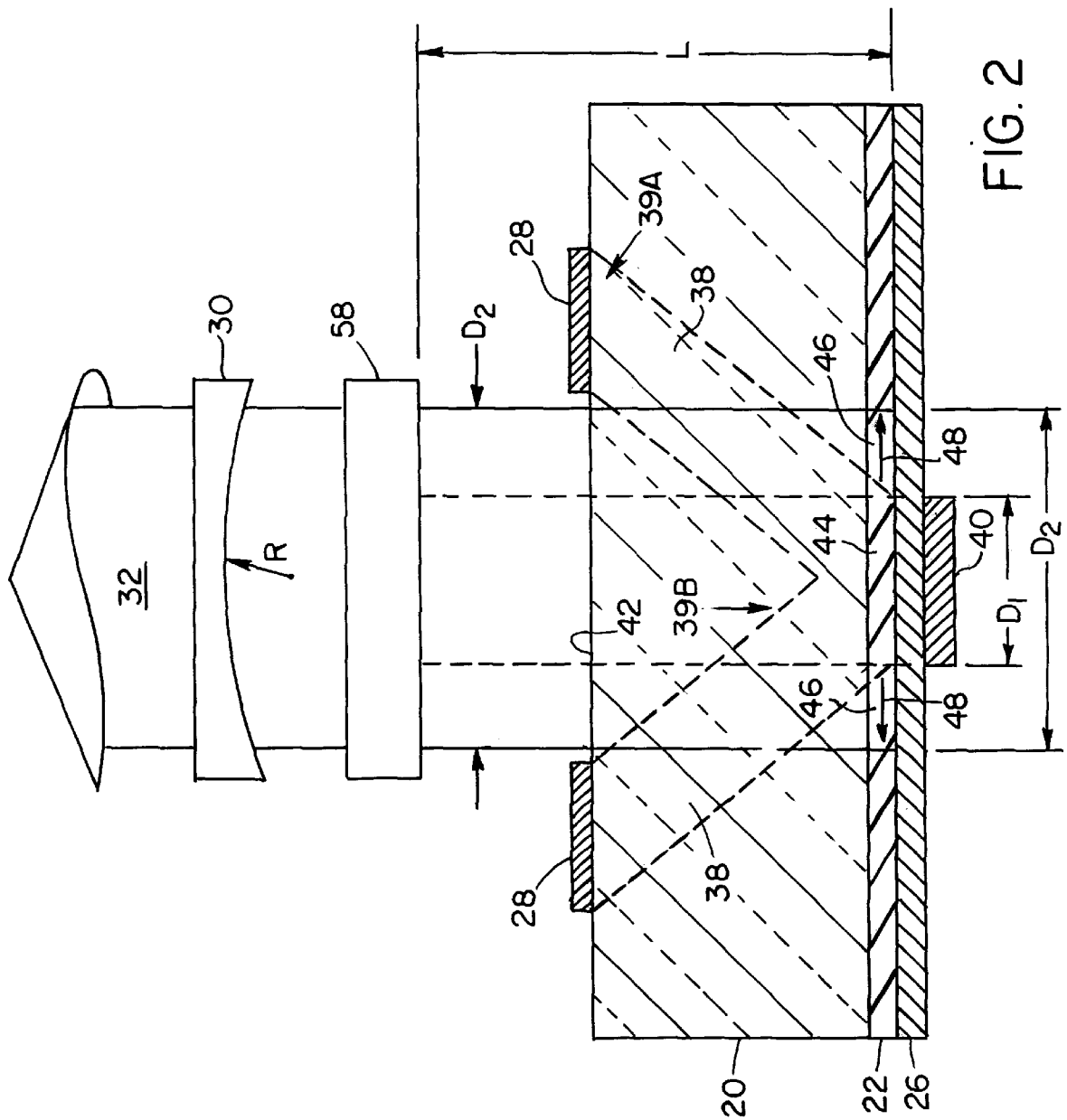
FIG. 2 is a cutaway side view of the configuration of FIG. 1 illustrating transverse propagation of spontaneous and stimulated emission from the first pumped volume into the second annular volume in accordance with the present invention.

As shown in the cross-sectional illustration of FIG. 2, the resonant cavity is pumped electrically through an annular electrical contact 28, causing current 38 to flow between annular contact 28 and circular contact 40 on opposite faces of the substrate 20. The resulting current flow 38 is generally conical in shape, the base 39A of the cone being at the annular contact 28 and the peak of the cone 39B being near contact 40. The flow in the peak 39B is generally circular in cross section and energizes a first substantially cylindrical volume 44 of the gain region 22, the first volume 44 being of a cross-sectional diameter $D_1$. The diameter $D_1$ is preferably substantially greater than the thickness of the gain region 22.

The excited gain region 22 of diameter $D_1$ generates stimulated and spontaneous emission, represented by arrows 48, which travels in a direction transverse to the propagation of the cavity laser beam. In standard prior-art VCSEL or VECSEL lasers, such energy would escape out the sides of the device or would otherwise be wasted as energy not contributing to the output beam 32. In the configuration of the present invention, this transverse energy 48 is absorbed in a second annular volume 46 surrounding the first pumped volume. This absorbed energy serves to pump the second volume 46, providing gain and therefore power into the fundamental laser mode 60.

When the electrical or optical pumping of the first region $D_1$ produces gain, this gain occurs for both the transverse and longitudinal directions. Since the traverse gain length is larger than the longitudinal gain length, more stimulated emission can occur in that direction. The larger the dimension $D_1$ the greater the net gain for stimulated emission in the transverse direction. Higher output power requires larger area devices because of thermal dissipation and the limit set by catastrophic degradation by the optical power density on the surface of the semiconductor in the longitudinal direction. For such large area devices, significant power can be lost by the occurrence of the transverse stimulated emission thereby reducing the overall power conversion efficiency. Spontaneous emission also occurs but becomes less important for the larger area devices. If the adjacent region is designed to absorb the stimulated emission (and also to a lesser extent the spontaneous emission), then the energy that otherwise would have been lost can be used to optically pump the second region $D_2$ to the extent that it will produce gain. The energy pumped into the second region $D_2$ can be extracted in the orthogonal direction by adjusting the external mirror 30 to produce a mode waist equal to $D_2$ on the gain medium. The external cavity mirror 30 will fix or "clamp" the gain in the total area defined by $D_1$ and $D_2$. There is a limit to the extent of the second region $D_2$, as the degree of transverse pumping decreases with decreasing intensity away from the center of the pumped region. This limit is related to the dimension $D_1$ and the pumping intensity (electrical or optical) in the area defined by $D_1$.

Given the mode waist diameter $D_2$, the technique for designing a cavity which would provide a suitable radius of curvature R for the second reflector 30 and the suitable optical cavity length L is well known in the art. See, for example, Herwig Kogelnik and Tingye Lee, "Beams, Modes, and Resonators", CRC Handbook of Lasers, CRC Press, 1971, pg. 421–441. The second diameter $D_2$ is a function of the excitation level and the diameter $D_1$. The design would be optimized for maximum output power limited by the circulating power density, which is limited by catastrophic degradation of the semiconductor, and the thermal power dissipation from the second diameter $D_2$. The mode waist diameter for the cavity could be matched, for example, by adjusting the cavity length L for a fixed radius of curvature R for the second reflector 30.

Figure 3:
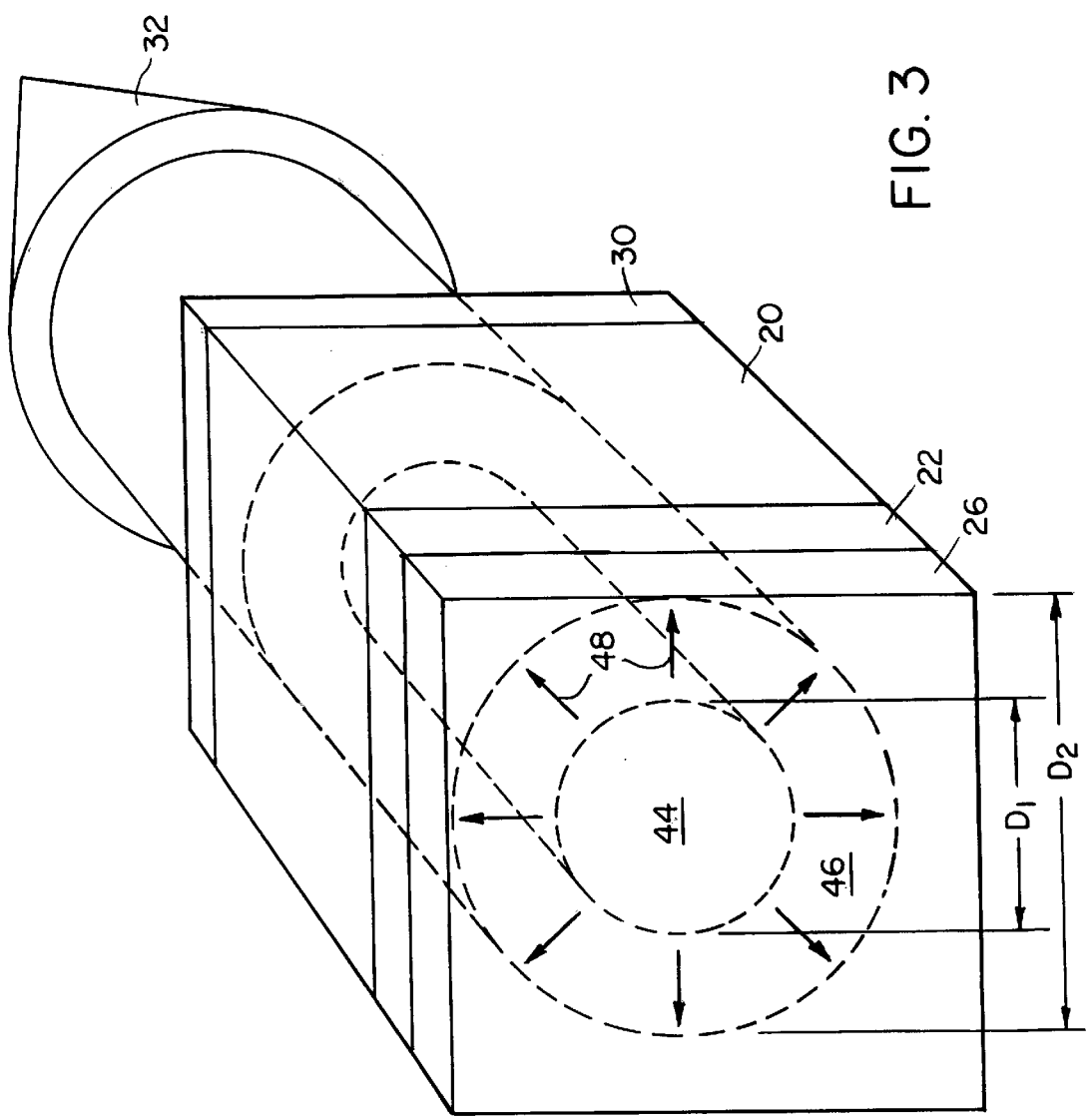
FIG. 3 is a perspective view of a VCSEL laser configuration illustrating the relationship of the first pumped volume and the second annular volume in accordance with the present invention.

FIG. 3 is a perspective view of a laser in a VSCEL configuration in accordance with the present invention illustrating the relationship of the first pumped volume 44 and the second output volume 46. The pumped first volume 44 is of diameter $D_1$ in the region of the gain medium 22. The transverse propagation of spontaneous and stimulated emission represented by arrows 48 optically pumps or otherwise energizes an annular volume 46 surrounding the first volume 44. The annular volume 46 has an inner diameter of $D_1$ and an outer diameter of $D_2$ and is substantially cross-sectionally concentric with the first volume 44 assuming a Gaussian beam distribution. The fundamental cavity mode is optimized to have a diameter approximately equal to the outer diameter $D_2$ of the second volume 46, such that energy in both first and second volumes is captured and therefore contributes to the output beam 32. Excitation of the first volume 44, may occur by electrical or optical means.

The laser cavity parameters are preferably adjusted to set the mode waist substantially equal to the diameter $D_2$ at the maximum operating power levels. In a laser cavity comprising a single flat mirror 26 and a single concave spherical mirror 30 having a radius of curvature R as shown in FIG. 2, the mode beam diameter on the laser chip $w_1$ and at the output mirror $w_2$ is characterized by:

$$w_1^2 = 4\lambda L/\pi[(R-L)/L]^{1/2} \quad (1)$$

$$w_2^2 = 4\lambda R/\pi[L/(R-L)]^{1/2} \quad (2)$$

where L is the cavity length and $\lambda$ is the wavelength of the output laser beam 32 as described in Kogehnik et al. cited above. It is clear from these equations that the diameter of the fundamental laser mode can be made equal to the outer diameter $D_2$ of the second volume 46, for example by adjusting the cavity length L for a specific radius of curvature R. Alternatively, the radius of curvature R may be selected for a specific range of cavity lengths L. Instead of curved mirrors, a flat output coupler 30 may be employed with a lens in the cavity, of appropriate geometry to achieve the same results. A physical lens or thermal lens may be used for this purpose.

A preferred embodiment of a semiconductor laser device may comprise a multiple element quantum well structure or a single gain region having a total gain thickness equivalent to that of a multiple quantum well structure. In order to achieve sufficient single pass gain, a 900 nanometer (nm) to 1100 nm wavelength laser structure formed in a semiconductor material such as GaInAs preferably has at least five quantum wells or an equivalent thickness. For more efficient operation, at least ten quantum wells are used in order to effectively overcome the optical losses due to free carrier absorption at the laser wavelength in the conductive substrate layer 20. A typical thickness for a single quantum well is approximately 8 nm. Note that the optical bandgap is dependent on the thickness of the quantum well and therefore an equivalent thickness for a single layer of gain material would have its wavelength somewhat shifted from the same compositional structure for the narrow quantum well material. The total thickness or the number of quantum wells can be increased to increase the gain to overcome all intracavity losses for efficient operation. This is limited only by the ability to uniformly grow such structures and by the practical threshold current density for such structures. Conventional VCSELs typically operate with only one or a few quantum wells between very high reflectivity mirrors. Such devices exhibit low optical gain and therefore would not operate as efficiently as the apparatus of the present invention.

The electrical current or optical pump energy injected into the laser device can be provided by any of the well-known methods, for example in G. P. Agarwal, "Semiconductor Lasers", The American Institute of Physics Press, pages 146–157. In a preferred embodiment of the present invention, most of the injection current 38 is directed into a circular region of a diameter equal to or less than the diameter $D_1$ of the fundamental spatial mode as defined by equations (1) and (2) above.

As described above, low efficiency frequency doubling of diode laser radiation using edge-emitting diode lasers has been demonstrated in the past by Gunter and Koslovsky et al. In contrast, the preferred embodiment of the present invention employs a VCSEL or VECSEL vertical cavity laser structure in which the total single pass gain is significantly lower than in edge-emitting lasers. In addition, the output from the vertical cavity device of the present invention is distributed over a much larger circular beam area than in edge-emitting devices, for example several hundred times greater in area. The achievable intracavity circulating power density in a fundamental circular spatial mode can exceed several $MW/cm^2$, limited only by catastrophic degradation at the semiconductor surface. While similar power densities can be achieved in edge-emitting lasers, the beam is confined to the waveguide of the diode cavity which makes frequency doubling difficult. Since the efficiency of frequency conversion is dependent on both the optical intensity and the length of the interaction region, frequency doubling of diode lasers is complicated and has been carried out in waveguide structures to maintain the field intensity of a sufficient interaction distance. A high conversion efficiency can be achieved in the present invention since high optical field intensities can be maintained over a sufficiently long interaction length because the beam is substantially non-divergent within the optical laser cavity. A high quality beam provides a more favorable frequency conversion situation for any conversion configuration outside of the cavity such as in the recently-studied periodically-poled nonlinear materials. Furthermore, the present invention can be operated in a pulsed, gain-switched, or mode-locked configuration to increase the optical power and therefore the nonlinear conversion efficiency. The present invention applies not only to harmonic frequency conversion, but also to sum and difference frequency generation. In a preferred embodiment, the nonlinear material includes Fabry-Perot resonances such that the laser operates in a single frequency. An exemplary configuration is illustrated in FIG. 2, which includes an intracavity non-linear crystal 58 between the substrate 20 and external mirror 30.

Each prior art configuration mentioned above, for example the Sandusky et al. and Hadley et al. configuration, was limited by matching the cavity geometry to the extent of the pumped volume only, unlike the present invention which extracts energy from the first pumped volume in addition to the second volume energized by transverse energy emission generated in the first volume.

The output power in the present invention can be magnified by increasing the diameter of the mode volume, as described above. Peak output power levels, for example in excess of 10 kW, can be generated from a gain area of one millimeter in diameter. Continuous cw output power levels may exceed 10 Watts from a single element device, limited only by thermal considerations.

A second harmonic radiation which propagates in the backward direction can additionally be absorbed in a semiconductor laser structure in such a way as to produce electrons and holes which migrate to the active gain region, thereby increasing the power of the fundamental laser radiation. This also has the effect of increasing efficiency of the second harmonic output as well as producing a single-ended output of harmonic radiation. In an alternative embodiment, a three-mirror cavity could be used in which the nonlinear material is disposed in a position in which the harmonic radiation does not reflect back into the gain medium but exits through the middle mirror. A ring resonator configuration may also be employed.

Typical frequency doubling materials appropriate for conversion of infrared wavelengths into the visible include periodically-poled $LiNbO_3$, KTP, and $KNbO_3$. For example KTP can be phase matched to convert 1 $\mu$m radiation into green wavelengths and $KNbO_3$ can convert infrared radiation into blue wavelengths using GaInAs diode lasers operating in the 900 nn wavelength range.

Many configurations for intracavity frequency doubling that are well known in the field can be used in the present invention. For example, a focusing lens can be positioned within the laser resonator defined by the mirrors 24 and 30 to increase the power density. The technique would allow use of very short lengths of nonlinear materials or nonlinear materials with lower nonlinear figures-of-merit.

For doubling materials such as KTP and $KNbO_3$, active crystal lengths can be significantly less than 1 cm for the circulating power levels possible in the present configurations. Shorter nonlinear material lengths provide wider temperature and wavelength phase matching conditions. For $KNbO_3$ for example, a crystal length of 1 mm or less can provide a temperature phase matching bandwidth of more than several degrees Celsius and a wavelength bandwidth of several nanometers. Such broad acceptance ranges make the manufacture and operation of such devices significantly more practical. The wavelength may be controlled by the selection of the alloy composition of the gain medium material, while precision wavelength control is achievable with intracavity etalons or other wavelength controlling techniques well known in the art. Similar results apply to other non-linear materials, including KTP.

The semiconductor gain region 22 preferably comprises a multiple-element quantum well structure. Alternatively, a single gain region whose total gain thickness is equal to that of the multiple quantum well structure may be employed. In order to achieve sufficient single pass gain, the number of quantum wells typical for a 900 nm to 1100 nm wavelength laser structure made from GaInAs should be more than 5 with a typical range of between 10 and 25 wells. For a high-peak-power device operating under pulsed conditions using either electrical or optical excitation, the number of wells may be more than 50. The limit is governed by the practical ability to grow large numbers of strain-free quantum well layers. In this case, a heterostructure may be a more effective choice. High-peak-power devices could be made, for example, by using high-power Q-switched solid state lasers as pump sources.

Conventional vertical cavity semiconductor lasers typically operate with only one or a few quantum wells and very high reflectivity cavity mirrors. Such devices may not operate as efficiently in the present invention because of inherently low optical gain. The net gain must be sufficient to overcome losses in the external cavity including the free carrier loss in the substrate material 22 and the optical losses in the nonlinear material and associated anti-reflection coating on the intracavity optical elements.

FIG. 2 illustrates a typical quantum-well device 22 formed on a semiconductor substrate 20. A highly reflective mirror 26 is grown on the back surface of the device to provide one of the mirrors of the laser resonator. The top cladding layer serves as a conductive contact which can be antireflection coated 42 and which has low optical absorption at the laser wavelength. In an alternative embodiment, a layer of electrically-conductive material with an optical bandgap greater than the second harmonic radiation serves as the conductive layer with a second layer, of thickness less than the diffusion length of carriers and transparent to the fundamental laser radiation, and absorbing the second harmonic radiation grown between the active material and the thick wide-bandgap material, would allow the optically excited carriers to diffuse into the gain region. The thick conductive material may comprise for example, deposited tin oxide.

Single frequency operation may be achieved, for example, by introducing an etalon in the cavity. Alternatively, the non-linear crystal 58 may also serve as a frequency selective element.

The ability to generate visible wavelengths in high-power output makes the present invention attractive to a range of applications including projection display, optical disc read and write, optical holographic memory storage, and bio-fluorescence sensors. For the case of projection display, three primary colors could be generated. For example, the blue wavelength and green wavelength could be produced by frequency doubling the output of GaInAs semiconductor lasers whose outputs could be selected in the wavelength range from 900 nm to more than 1100 nm. Appropriate frequency doubling materials include KTP for the green wavelength and $KNbO_3$ for the blue wavelength. Power may be scaled using arrays of such devices. Output power levels of several tens of Watts may be generated. Since the output from such an array would lack coherence between elements of the array, the effects of speckle would be significantly reduced so as not to affect the quality of the projected image in the display system. In the case of an array device, the output couplers may comprise an array of lithographically-produced binary optical mirrors or micromirrors whose positions are precisely aligned with the center of the diode laser emitting areas.

A projection display system employing the present invention could be operated using various light valve devices such as liquid crystal spatial light modulators, micro-mirrors such as those sold by Texas Instruments, and grating deflector light valves such as those developed by Silicon Light Machines of Sunnyvale, Calif. For an array of laser sources, all elements of the light valve could be illuminated by every laser source by allowing the individual laser beams to expand so they overlap in the far field. In this way, the failure of one element would not significantly degrade the operation of the system. Binary optical lenses may be used to focus the laser light in a top-hat distribution onto each pixel of the light valve to make efficient use of all available laser radiation.

While this invention has been particularly shown and described with references to preferred embodiments thereof, it will be understood by those skilled in the art that various changes in form and details may be made therein without departing from the spirit and scope of the invention as defined by the appended claims.

Figure 4:
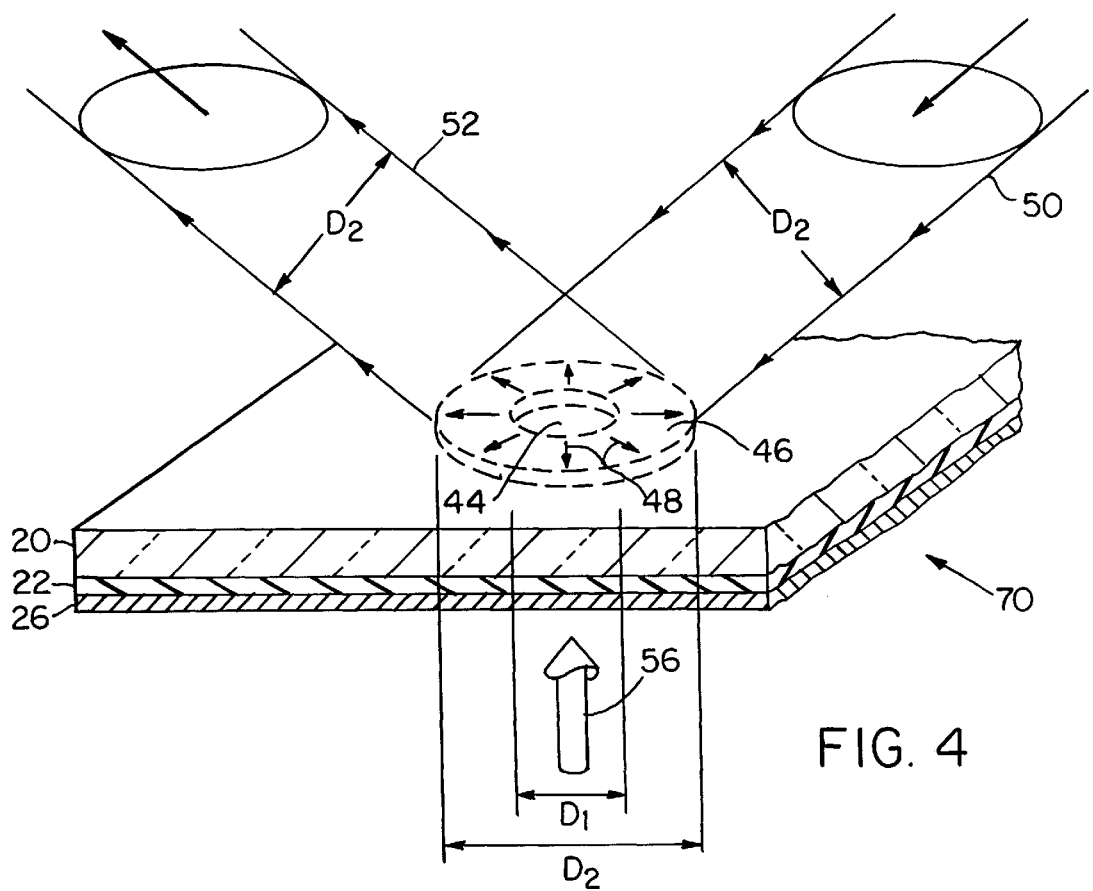
FIG. 4 is a perspective illustration of an optical amplifier configuration in accordance with the present invention.

As an example of an alternative embodiment, FIG. 4 is a perspective illustration of the present invention configured as an optical amplifier 70. As in the laser configuration, the optical amplifier 70 configuration includes a semiconductor substrate 20, a semiconductor gain medium 22, and a first reflector 26. Note that a second reflector is not required as the optical amplifier 70 does not include a resonant cavity. A first volume 44 of the gain medium 22 is pumped with electrical or optical energy 56. The first volume 44 is generally cross-sectionally circular, having a diameter $D_1$. As described above, this causes transverse stimulated and spontaneous propagation of energy 48 into a second volume 46 about the first volume 44. In a preferred embodiment, the second volume 46 is substantially circular in cross-section, the diameter being $D_2$. An incident beam 50 of diameter $D_2$ and of a first amplitude is directed at the pumped region 46, overlapping with and being energized by both the first volume 44 and second volume 46. The incident beam 50 reflects at mirror 26 and is released as an output beam 52 of similar diameter 4. The output beam 52 is amplified by the energized gain region 46 and is therefore of higher intensity than the incident beam 50. A plurality of such gain elements may be used to increase the total gain of the system.

I claim:

1. A laser comprising:
   first and second reflectors defining a resonant cavity;
   a gain medium disposed within said resonant cavity; and
   an energy source for energizing said gain medium within a first volume, wherein
   said resonant cavity defines a fundamental cavity mode of an associated laser beam;
   said energy source causes optical energy emission to propagate in said gain medium in a direction substantially transverse to said fundamental cavity mode;
   said transverse energy emission optically pumps a second volume of said gain medium about said first volume;
   the energy within said first and second volumes is coupled into said fundamental cavity mode; and
   said energy source energizes the gain medium by optical excitation.

2. The laser of claim 1 further comprising a nonlinear material disposed in the path of the laser beam for adjusting the frequency of the beam.

3. The laser of claim 2 wherein the non-linear material is disposed within the laser cavity.

4. The laser of claim 2 wherein the non-linear material is disposed external to the laser cavity.

5. The laser of claim 2 wherein the non-linear material is selected from the group consisting of KTP, $LiNbO_3$, periodically-poled $LiNbO_3$, KTN, and $KNbO_3$.

6. The laser of claim 1 further comprising an intracavity tuning element selected from the group consisting of an etalon, a birefringent element, a prism, and a grating.

7. The laser of claim 1 further comprising a conductive material transparent to the fundamental wavelength and absorbent of second harmonic radiation grown adjacent to the gain region such that second harmonic light is absorbed in said conductive material and electrons and holes diffuse into the gain region to increase the efficiency of second harmonic radiation emitted in a forward direction.

8. The laser of claim 1 further comprising a conductive material transparent to the fundamental wavelength and absorbent of second harmonic radiation grown adjacent to the gain region such that second harmonic light is absorbed in said conductive material and electrons and holes diffuse into the gain region to increase the efficiency of second harmonic radiation emitted in a forward direction.

9. Multiple lasers of claim 1 configured as an array of addressable elements.

10. A laser comprising:
    first and second reflectors defining a resonant cavity for an associated laser beam;
    a semiconductor substrate;
    a semiconductor gain medium on said substrate;
    an energy source for energizing said gain medium within a first volume; and
    a non-linear material disposed in the path of said laser beam for adjusting the frequency of the beam;
    wherein
    both said substrate and said gain medium are inside said resonant cavity;
    said resonant cavity defines a fundamental cavity mode of said associated laser beam;
    said energy source causes optical energy emission to propagate in said gain medium in a direction substantially transverse to said fundamental cavity mode;
    said transverse emission optically pumps a second volume of said gain medium about said first volume; and
    said energy within said first and second volumes is coupled into said fundamental cavity mode.

11. A laser comprising:
    a resonant cavity between configured first and second reflectors, said resonant cavity defining a fundamental cavity mode;
    a gain medium disposed within said resonant cavity; and
    an energy source for energizing said gain medium within a first volume,
    wherein
    said resonant cavity defines a fundamental cavity mode of an associated laser beam;
    said energy source causes optical energy emission to propagate in said gain medium in a direction substantially transverse to said fundamental cavity mode;

said transverse emission optically pumps a second volume of said gain medium about said first volume; and said energy within said first and second volumes is coupled into said fundamental cavity mode.

12. The laser of claim 11 wherein said first volume is substantially cylindrical and of cross-sectional diameter $D_1$ and said second volume is substantially an annulus of outer cross-sectional diameter $D_2$ and inner cross-sectional diameter $D_1$, said first and second volumes being substantially cross-sectionally concentric.

13. The laser of claim 11 wherein the gain medium comprises a material selected from the group consisting of semiconductor, multiple-quantum-well semiconductor and solid state.

14. The laser of claim 11 further comprising an annular electrode and a circular electrode disposed on opposite sides of said gain medium which, when energized, electrically pumps said first volume of the laser with current.

15. The laser of claim 11 further comprising a substrate layer having a first face adjoining said gain medium and said first reflector, and a second face adjoining said second reflector that is configured with a preselected curvature.

16. A device for lasing, comprising:

first and second reflectors positioned at opposite ends of a resonant cavity, an active region disposed within the resonant cavity; and a first contact disposed on said first reflector, wherein said first and second reflectors are adapted to define a fundamental emission mode traveling through the resonant cavity;

said first contact defines a first volume in said active region;

said first contact is adapted to transmit electrical energy into said first volume of said active region;

said electrical energy causes optical energy emission in the first volume of said active region including transverse optical energy emission propagating in a direction substantially transverse to the fundamental emission mode;

said transverse optical energy emission optically pumps a second volume in said active region immediately surrounding the first volume; and the optical energy emission in the first and second volumes is substantially coupled into the fundamental emission mode.

17. The device of claim 16, further comprising:

a semiconductor material disposed on said active region at a first end; and a second contact disposed on said semiconductor material at a second end, opposite to the first, said second contact being adapted to transmit electrical energy into said semiconductor material.

18. The device of claim 17, wherein the first volume is of substantially cylindrical shape and the second volume is of substantially annular shape immediately surrounding the first volume, the first and second volumes being substantially cross-sectionally concentric.

19. The device of claim 17, wherein said first and second contacts are adapted to transmit electrical energy for electrically pumping the first volume of said active region, said first and second contacts defining an electrical energy path through said semiconductor material, said active region, and said first reflector.

20. The device of claim 19, wherein said first contact is of substantially circular shape, said second contact is of substantially annular shape, and the electrical energy path is defined by electrical current flowing between said first and second contacts.

21. The device of claim 17, wherein said second reflector is directly adjacent to said semiconductor material at the second end.

22. The device of claim 17, wherein said second reflector is external to said semiconductor material.

23. The device of claim 17, wherein said active region includes a solid state material.

24. The device of claim 23, wherein said solid state materials is chosen from a group of materials comprising Er:glass, Yb:glass, or Yb:YAG.

25. The device of claim 17, wherein said active region includes a semiconductor material.

26. The device of claim 25, wherein said active region comprises at least one quantum-well semiconductor material structure.

27. The device of claim 17, further comprising a nonlinear material positioned within the resonant cavity for conversion of a frequency of the fundamental emission mode.

28. The device of claim 27, wherein said nonlinear material is selected from a group of materials comprising KTP, KTN, $KNbO_3$, $LiNbO_3$, or periodically-poled $LiNbO_3$.

29. The device of claim 27, wherein said nonlinear material is disposed on said semiconductor material at the second end.

30. The device of claim 27, wherein said nonlinear material is disposed external to said semiconductor material.

31. A method for improving efficiency of a laser device, comprising the following steps:

positioning first and second reflectors to thereby define a fundamental emission mode of the laser device;

positioning a first contact on the first reflector to thereby define a first volume in an active region of the laser device;

electrically energizing the active region through the first contact to thereby generate optical energy emission in the first volume;

propagating optical energy along the active region from the first volume into a second volume immediately adjacent to the first volume, to thereby optically stimulate said second volume; and adapting the first and second reflectors to couple the optical energy emission in both of the first and second volumes into the fundamental emission mode.

32. The method of claim 31, further comprising the following steps:

positioning a semiconductor material layer directly adjacent to the active region at a side remote from the first reflector; and positioning a second contact on the semiconductor material layer to thereby define an electrical energy path through the semiconductor material layer between the first contact and the second contact within the laser device.

33. The method of claim 31, further comprising a step of converting a frequency of the fundamental emission mode by positioning a nonlinear material between the first and second reflectors.

34. A vertical cavity surface emitting laser comprising:

a resonant cavity between first and second reflectors, said resonant cavity defining a fundamental cavity mode;

a gain medium disposed within said resonant cavity; and an optical energy source for optically exciting said gain medium within a first volume of said gain medium and thereby producing a population inversion and stimulated optical emission, the transverse extent of said first volume being substantially greater than the thickness of said gain medium, wherein stimulated optical emission from the first volume propagates substantially in a direction transverse to the direction of the fundamental cavity mode and optically excites the gain medium in an annular second volume surrounding said optically pumped first volume, thereby producing a population inversion in the gain medium within said second volume, and substantially all of the excitation energy from the first said volume that is absorbed in the second said volume is emitted by stimulated emission into the fundamental cavity mode.

35. The vertical cavity surface emitting laser of claim 34, further comprising a non-linear material disposed within the resonant cavity for conversion of a frequency of the optical emission of the laser.

36. The vertical cavity surface emitting laser of claim 34, wherein the first volume is substantially cylindrical and the second volume is substantially annular in shape, and the first and second volumes are substantially cross-sectionally concentric.

37. The vertical cavity surface emitting laser of claim 34, further comprising a semiconductor material wherein said gain medium is directly adjacent to said semiconductor material at a first end and said second reflector is directly adjacent to said semiconductor material at a second end, opposite to the first.

38. The vertical cavity surface emitting laser of claim 34, further comprising a semiconductor material wherein said gain medium is directly adjacent to said semiconductor material at a first end and said second reflector is external to said semiconductor material at a second end, opposite to the first.

39. A vertical cavity surface emitting laser comprising:

a resonant cavity between first and second reflectors, said resonant cavity defining a fundamental cavity mode;

a gain medium disposed within said resonant cavity; and an electrical energy source for electrically exciting said gain medium within a first volume and thereby producing a population inversion and stimulated optical emission, the transverse extent of said first volume being substantially greater than the thickness of said gain medium, wherein stimulated optical emission from the first volume propagates substantially in a direction transverse to the direction of the fundamental cavity mode and optically excites the gain medium in an annular second volume surrounding said optically pumped first volume, thereby producing a population inversion in the gain medium within said second volume, and substantially all of the excitation energy from the first said volume that is absorbed in the second said volume is emitted by stimulated emission into the fundamental cavity mode.

40. The vertical cavity surface emitting laser of claim 39, further comprising a non-linear material disposed within the resonant cavity for conversion of a frequency of the optical emission of the laser.

41. The vertical cavity surface emitting laser of claim 39, wherein the first volume is substantially cylindrical and the second volume is substantially annual, the first and second volumes are substantially cross-sectionally concentric.

42. The vertical cavity surface emitting laser of claim 39, further comprising a semiconductor material directly adjacent to said gain medium at a first end.

43. The vertical cavity surface emitting laser of claim 42, wherein said second reflector is directly adjacent to said semiconductor material at a second end, opposite to the first.

44. The vertical cavity surface emitting laser of claim 42, wherein said second reflector is external to said semiconductor material at a second end, opposite to the first.

45. The vertical cavity surface emitting laser of claim 42, wherein said electrical energy source comprises:

a first contact directly adjacent to the first reflector for electrically exciting the first volume within said gain medium; and a second contact directly adjacent to said semiconductor material at the second end for defining an electrical energy path between said first and second contacts.

* * * * *

UNITED STATES PATENT AND TRADEMARK OFFICE
CERTIFICATE OF CORRECTION

PATENT NO.     : 6,243,407 B1
DATED          : June 20, 2003
INVENTOR(S)    : Aram Mooradian It is certified that error appears in the above-identified patent and that said Letters Patent is hereby corrected as shown below:

Column 10,
Cancel claim 8, which is a duplicate of claim 7.

Drawings,
Replace Fig 2 with the attached corrected Fig 2.
For the record, the correction may be described in words as follows:
In figure 2, the dimension "L" (cavity length) should extend from first reflector 26 to second reflector 30, such that crystal 58 is inside the cavity.

Signed and Sealed this

Seventh Day of October, 2003

JAMES E. ROGAN
*Director of the United States Patent and Trademark Office*